(12) United States Patent
Chao et al.

(10) Patent No.: US 7,306,351 B2
(45) Date of Patent: Dec. 11, 2007

(54) LENS FOR SIDE EMITTING LED DEVICE

(75) Inventors: Chang Po Chao, Jonli (TW); Lun De Liao, Jonli (TW); Cho Wei Chiu, Jonli (TW)

(73) Assignee: Chung Yuan Christian University, Taoyuan (TW)

( * ) Notice: Subject to any disclaimer, the term of this patent is extended or adjusted under 35 U.S.C. 154(b) by 0 days.

(21) Appl. No.: 11/304,949

(22) Filed: Dec. 14, 2005

(65) Prior Publication Data

US 2007/0236937 A1  Oct. 11, 2007

(51) Int. Cl.
*F21V 5/00* (2006.01)

(52) U.S. Cl. ............... 362/327; 362/308; 362/340

(58) Field of Classification Search ........... 362/308, 362/309, 327, 332, 337, 338, 340; 313/512
See application file for complete search history.

(56) References Cited

U.S. PATENT DOCUMENTS

| | | | |
|---|---|---|---|
| 4,698,730 A * | 10/1987 | Sakai et al. ............... 362/311 |
| 6,547,423 B2 * | 4/2003 | Marshall et al. ............ 362/333 |
| 6,679,621 B2 | 1/2004 | West et al. ................ 362/327 |
| 7,172,319 B2 * | 2/2007 | Holder et al. .............. 362/341 |
| 7,181,378 B2 * | 2/2007 | Benitez et al. ................ 703/2 |

* cited by examiner

*Primary Examiner*—John Anthony Ward
(74) *Attorney, Agent, or Firm*—WPAT, P.C.; Justin I. King

(57) ABSTRACT

A light emitting device includes an LED package bases, an LED chip disposed on the LED package base, and a lens disposed on the LED package base. The lens includes a frustum shape having an inclined outer peripheral surface, and having a relatively smaller lower portion for attaching onto the LED package base, and having a relatively greater upper portion spaced away from the LED package base, the lens includes a longitudinal axis arranged to have an included angle θ formed between the longitudinal axis and the inclined outer peripheral surface of the lens, for reflecting light sidewise. The lens may include a curved recess formed in the upper portion for such as light diffusing purposes.

20 Claims, 4 Drawing Sheets

LENS FOR SIDE EMITTING LED DEVICE

BACKGROUND OF THE INVENTION

1. Field of the Invention

The present invention relates to a lens, and more particularly to a lens for attaching to an LED (light emitting diode) package base of a side emitting LED package device or a light emitting device, and for facilitating the light illumination of the side emitting LED device.

2. Description of the Prior Art

Typical light emitting diode (LED) packages comprise a hemispherical lens attached onto an LED chip which may generate and emit light through the hemispherical lens. However, the conventional LED packages are inefficient as they require a large number of LED packages to illuminate the light guide and result in coupling inefficiencies due to relatively small acceptance angles and/or areas.

U.S. Pat. No. 6,679,621 to West et al. discloses one of the typical LED packages comprising a lens coupled to an LED package base, and including a sawtooth portion for reflecting the lights generated and emitted by the LED chips, and for increasing the illuminated areas.

However, the lights reflected by or through the sawtooth portion of the lens may be interfered with each other, or may be offset with each other, such that the illuminated angles and/or areas may not be greatly increased. In addition, some of the light portions may be parallel to some of the inclined surfaces of the sawtooth portion of the lens and may not be suitably reflected by or through the sawtooth portion of the lens.

The present invention has arisen to mitigate and/or obviate the afore-described disadvantages of the conventional lenses for the side emitting LED devices.

SUMMARY OF THE INVENTION

The primary objective of the present invention is to provide a light emitting device including a lens for attaching to an LED (light emitting diode) package base of a side emitting LED package device or a light emitting device, and for facilitating the light illumination of the side emitting LED device.

In accordance with one aspect of the invention, there is provided a light emitting device comprising an LED package bases, an LED chip disposed on the LED package base, and a lens disposed on the LED package base, and including a frustum shape having an inclined outer peripheral surface, and having a relatively smaller lower portion for attaching onto the LED package base, and having a relatively greater upper portion spaced away from the LED package base, the lens including a longitudinal axis arranged to have an included angle θ formed between the longitudinal axis and the inclined outer peripheral surface of the lens, for reflecting light sidewise.

The included angle θ formed between the longitudinal axis and the inclined outer peripheral surface of the lens is ranging from 45 to 52°. The lens is preferably made of poly methyl methacrylate (PMMA) materials.

The lens includes a curved recess formed in the upper portion thereof, for such as light diffusing purposes. A hood may further be provided and attached onto the LED package base for shielding or protecting the LED chip, and/or for preventing the LED chip from being damaged by other objects.

Further objectives and advantages of the present invention will become apparent from a careful reading of the detailed description provided hereinbelow, with appropriate reference to the accompanying drawings.

DETAILED DESCRIPTION OF THE PREFERRED EMBODIMENT

Figure 1:
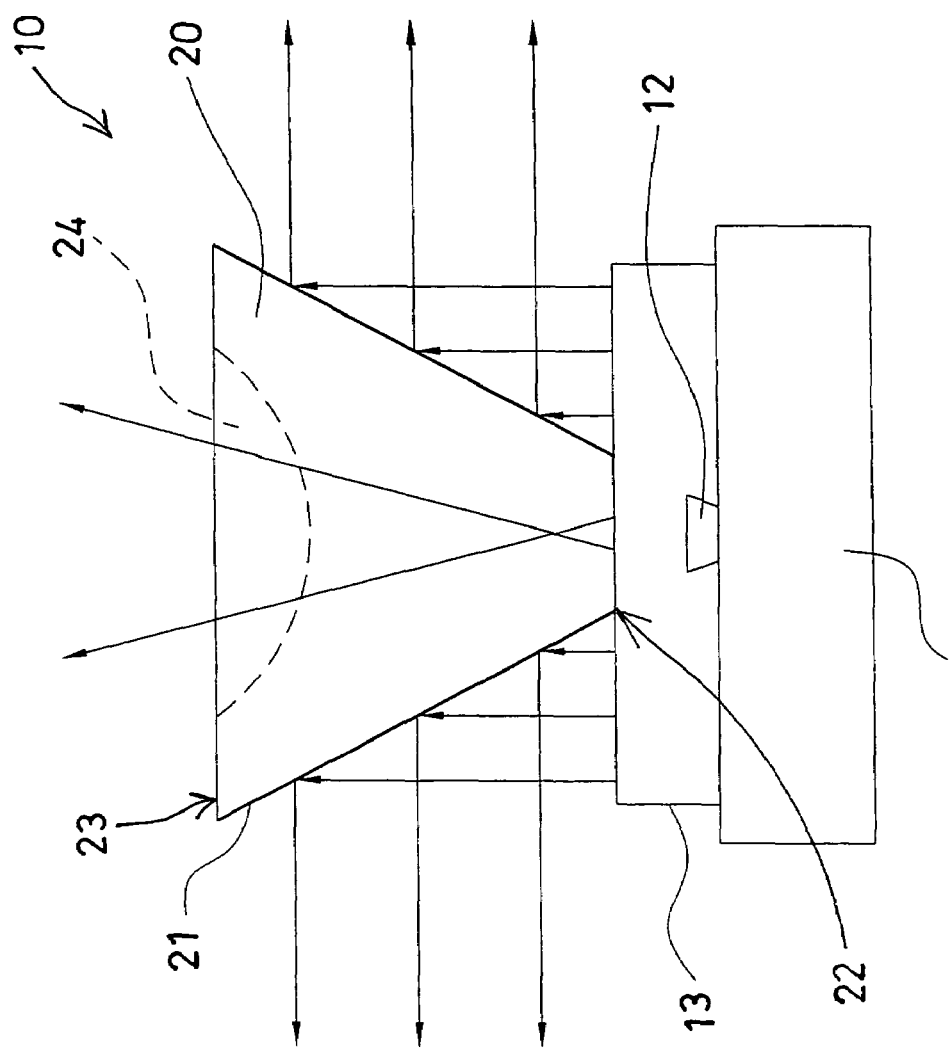
FIG. 1 is a plan schematic view of a light emitting device or an LED package in accordance with the present invention.
Figure 2:
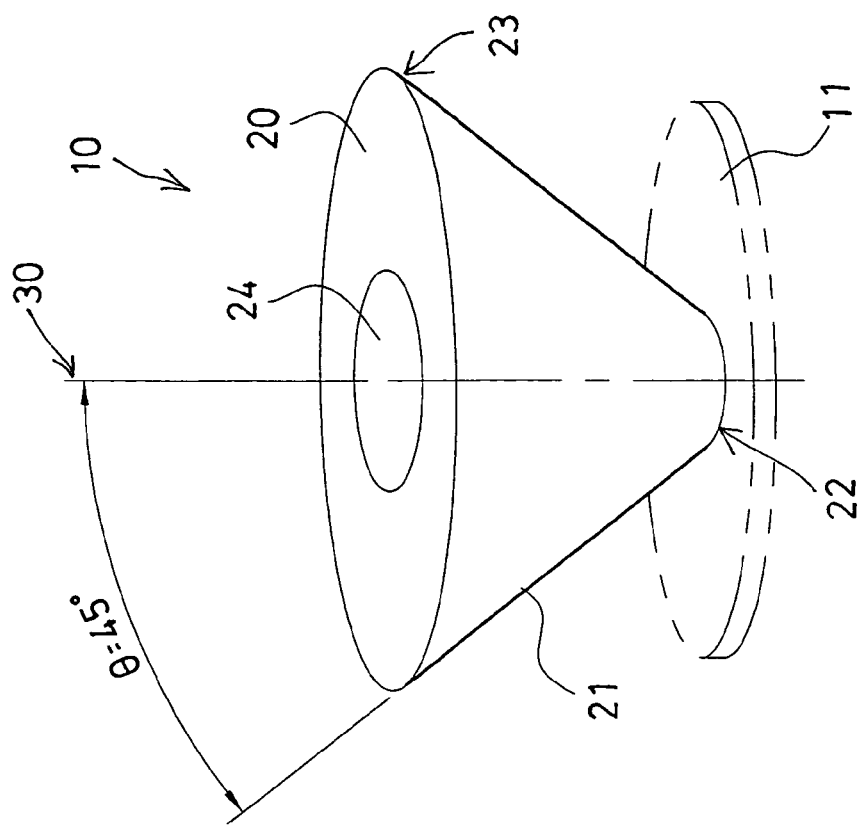
FIG. 2 is a partial perspective view illustrating a lens of the light emitting device.

Referring to the drawings, and initially to FIGS. 1 and 2, a light emitting device 10 in accordance with the present invention comprises an LED package bases 11, an LED chip 12 disposed on the LED package bases 11, and a cap or hood 13 selectively or optionally attached onto the LED package bases 11, for suitably shielding or protecting the LED chip 12, and/or for preventing the LED chip 12 from being damaged by other objects.

The light emitting device 10 further comprises a lens 20 disposed on or attached onto the hood 13, or directly attached onto the LED package bases 11, and including a frustum shape having an inclined or tapered outer peripheral surface 21, and having a relatively reduced or smaller lower portion 22 for attaching onto the hood 13, or for directly attaching onto the LED package bases 11, and having a relatively enlarged or greater upper portion 23 that is spaced away from the hood 13 and/or the LED package bases 11.

Figure 3:
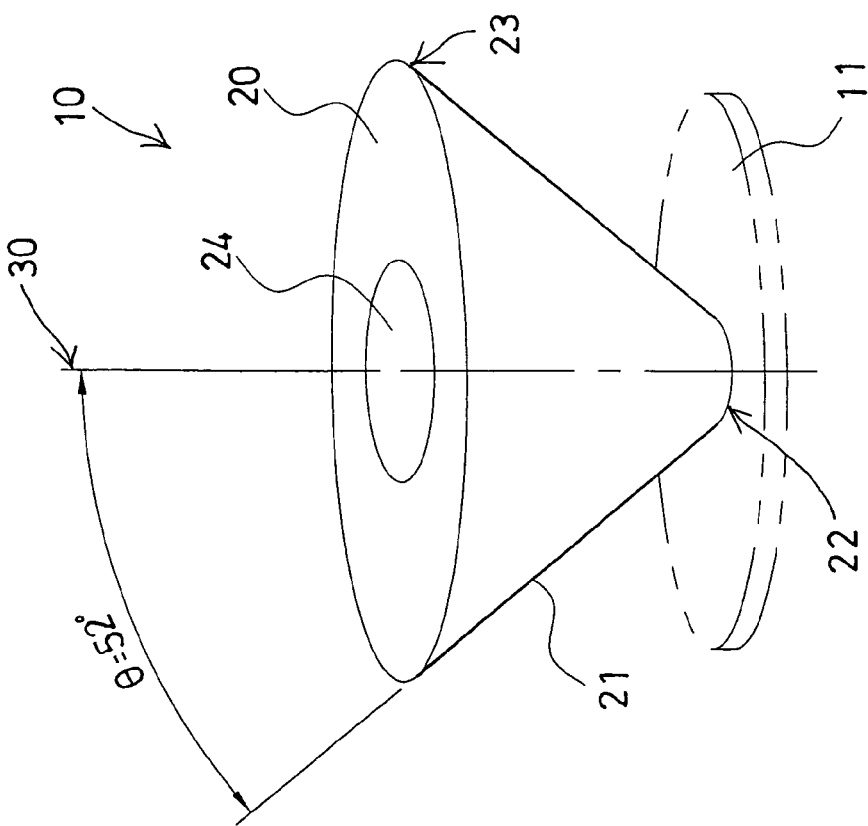
FIG. 3 is a partial perspective view similar to FIG. 2, illustrating the other arrangement of the lens of the light emitting device.

The lens 20 further includes a longitudinal axis 30 arranged to have an included angle θ formed or provided between the longitudinal axis 30 and the inclined or tapered outer peripheral surface 21 of the lens 20. It is further preferable, but not necessarily, that the included angle θ formed or provided between the longitudinal axis 30 and the inclined or tapered outer peripheral surface 21 of the lens 20 is ranging from 45 to 52°, as shown in FIGS. 2 and 3 respectively, for reflecting the light sidewise.

The lens 20 is preferably made of light permeable materials, such as poly methyl methacrylate (PMMA) materials, which allows the lights to suitably emit through the lens 20. However, the inclined or tapered outer peripheral surface 21 of the lens 20 is a light reflective surface 21 for suitably reflecting the lights. For example, a light reflective material or layer or sheet may be attached onto the inclined or tapered outer peripheral surface 21 of the lens 20 to form or define the light reflective surface 21 and to suitably reflect the lights (FIG. 1). It is preferable that the lens 20 includes a curved recess 24 formed in the upper portion 23 thereof, for acting as a concave lens, and for light diffusing purposes.

In operation, as shown in FIG. 1, a portion of the light generated and emitted by the LED chip 12 may be reflected by the reflective inclined or tapered outer peripheral surface 21 of the lens 20, and the other portion of the light generated and emitted by the LED chip 12 may be emitted through the lens 20 and suitably diffused by or via the curved recess 24 of the lens 20, such that the illuminated area and/or angle may be suitably increased or facilitated.

Figure 4:
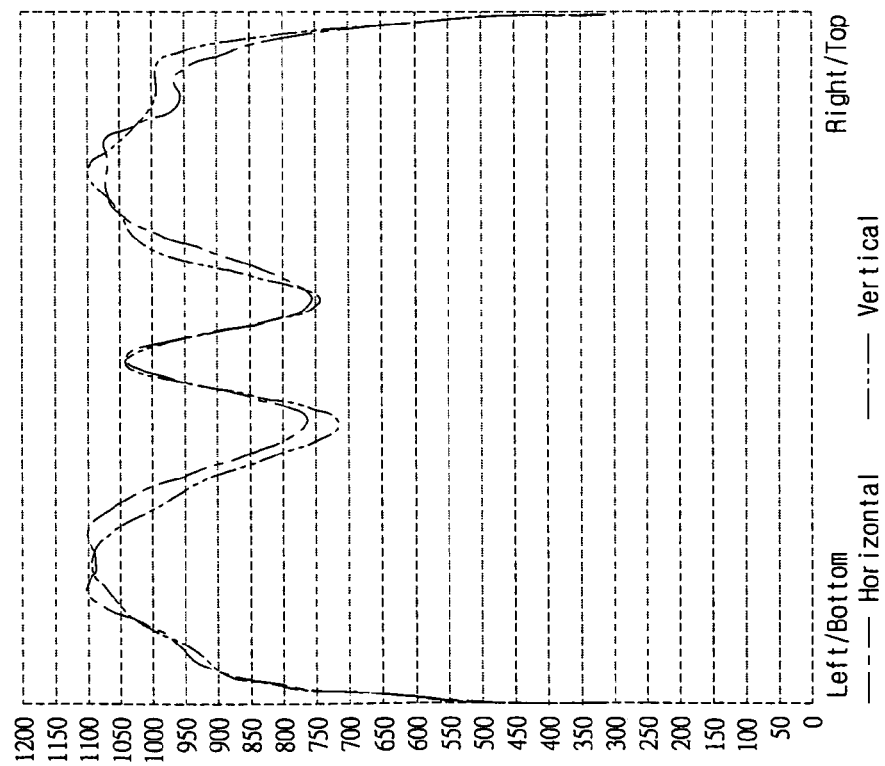

Referring next to FIG. 4, illustrated is the test results or the illumination or brightness of the light through the lens 20 of the light emitting device 10 having a 52° included angle θ formed or provided between the longitudinal axis 30 and the inclined or tapered outer peripheral surface 21 of the lens 20. As illustrated in the diagram, the light has been suitably reflected to the side portions of the light emitting device 10, such that the center portion and the side portions of the light emitting device 10 may all include a greater or greatly increased illumination or brightness.

Figure 5:
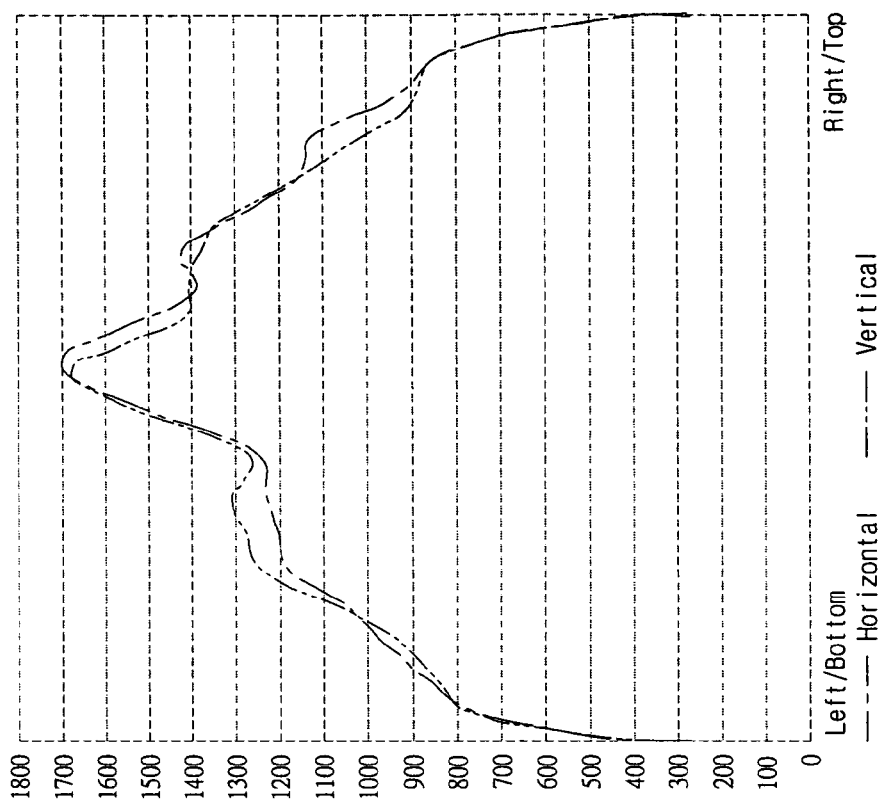
FIGS. 4, 5 are diagrams illustrating the test results or the illumination or brightness of the light through different lenses of the light emitting device.

Referring next to FIG. 5, illustrated is the test results or the illumination or brightness of the light through the lens 20 of the light emitting device 10 having a 45° included angle θ formed or provided between the longitudinal axis 30 and the inclined or tapered outer peripheral surface 21 of the lens 20. As illustrated in the diagram, the center portion of the light emitting device 10 has a greater illumination or brightness as compared with the side portions of the light emitting device 10, and has a uniformly distributed illumination or brightness.

Figure 7:
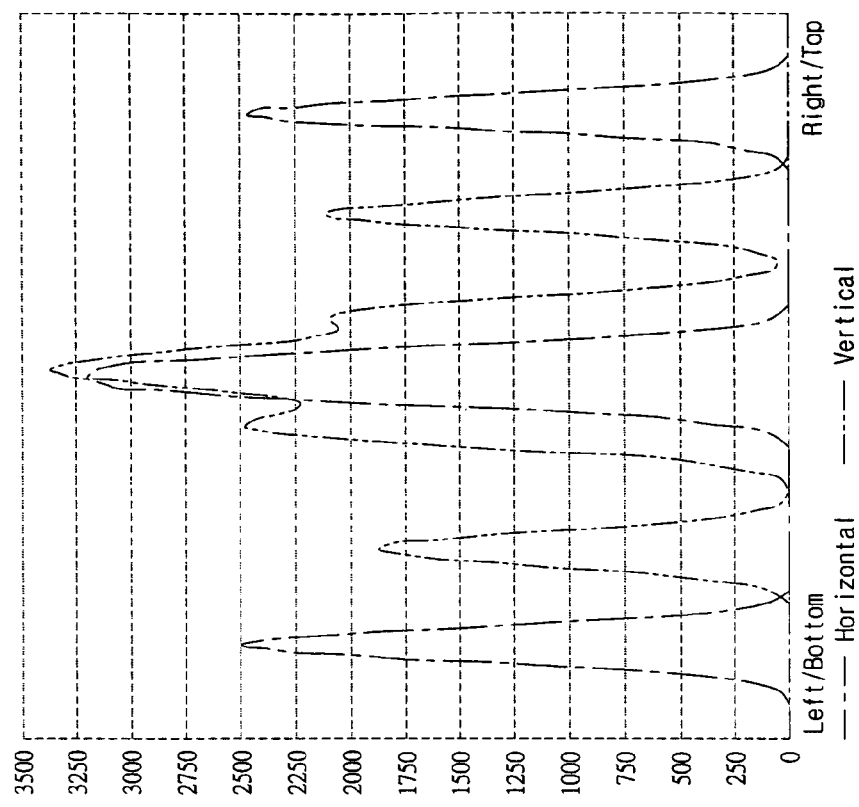
FIG. 7 is a diagram illustrating the test results or the illumination or brightness of the light generated by a light crystal display (LCD) module having eighty eight (88) LEDs disposed thereon, and having no lens in accordance with the present invention disposed thereon.
Figure 6:
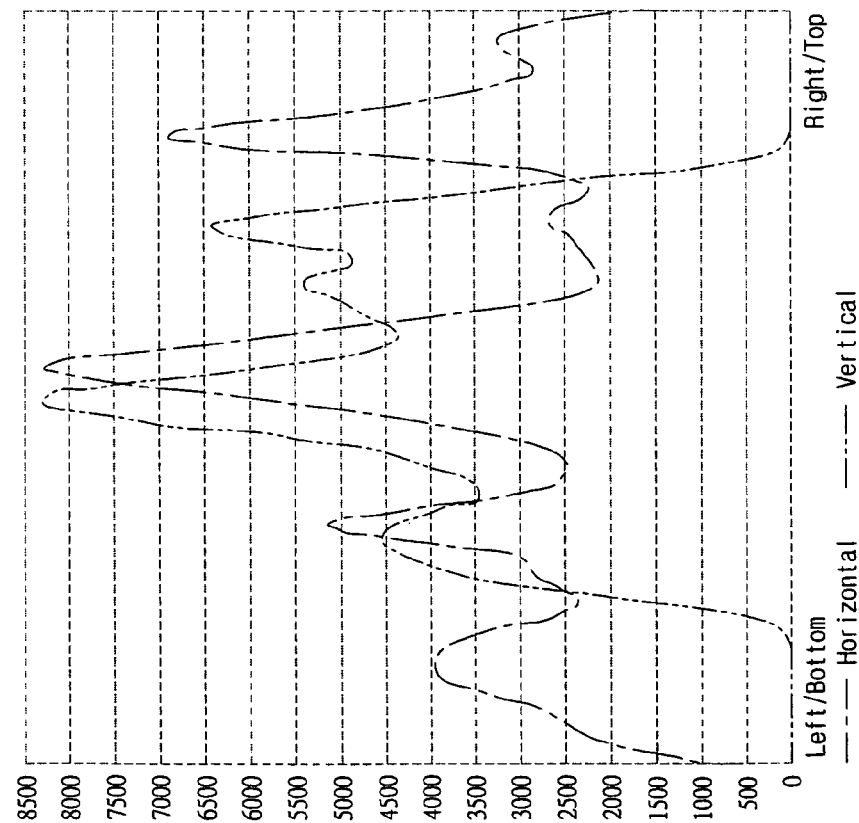
FIG. 6 is a diagram illustrating the test results or the illumination or brightness of the light generated by a light crystal display (LCD) module having eighty eight (88) LEDs disposed thereon, and having the lens in accordance with the present invention disposed thereon.

Referring next to FIGS. 6 and 7, illustrated are the test results or the illumination or brightness of the light generated by a thirty-seven-inch light crystal display (LCD) module which includes eighty eight (88) LEDs disposed thereon, in which FIG. 6 has the lens 20 in accordance with the present invention disposed thereon, and the center portion of the light emitting device 10 has a greatly increased illumination or brightness up to 8000-8500 nit, and the light emitting device 10 may have a uniformly distributed illumination or brightness.

However, as shown in FIG. 7, when no lens disposed on the light emitting device 10, the illumination or brightness of the light emitting device 10 is greatly decreased, and the light emitting device 10 may not have a uniformly distributed illumination or brightness.

Accordingly, the light emitting device in accordance with the present invention includes a lens for attaching to the LED package bases of the side emitting LED devices, and for facilitating the light illumination of the side emitting LED devices.

Although this invention has been described with a certain degree of particularity, it is to be understood that the present disclosure has been made by way of example only and that numerous changes in the detailed construction and the combination and arrangement of parts may be resorted to without departing from the spirit and scope of the invention as hereinafter claimed.

We claim:

1. A light emitting device comprising:
an LED package bases,
an LED chip disposed on said LED package base, and
a lens disposed on said LED package base, and including a frustum shape having an inclined outer peripheral surface, and having a relatively smaller lower portion for attaching onto said LED package base, and having a relatively greater upper portion spaced away from said LED package base, said lens including a longitudinal axis arranged to have an included angle θ formed between said longitudinal axis and said inclined outer peripheral surface of said lens, for reflecting light sidewise.

2. The light emitting device as claimed in claim 1, wherein said included angle θ formed between said longitudinal axis and said inclined outer peripheral surface of said lens is ranging from 45° to 52°.

3. The light emitting device as claimed in claim 1, wherein said lens is made of poly methyl methacrylate (PMMA) materials.

4. The light emitting device as claimed in claim 1, wherein said lens includes a curved recess formed in said upper portion thereof, for light diffusing purposes.

5. The light emitting device as claimed in claim 1 further comprising a hood attached onto said LED package base.

6. A LED lens, comprising:
a first surface, situated at the bottom of said LED lens;
a second surface, situated at the top of said LED lens, wherein the area of said second surface is bigger than the area of said first surface, and light from a LED entering said lens through said first surface exits said lens through said second surface; and
a reflecting surface, straight extending as a lateral peripheral surface of a frustum from said first surface to said second surface and obliquely angled with respect to a central axis of said lens, wherein light from said LED entering said lens through said first surface and incident on said reflecting surface from the inside of said LED lens is reflected by said reflecting surface to exit said LED lens through said second surface, and light from said LED not entering said lens and directly incident on said reflecting surface from the outside of said LED lens is reflected by said reflecting surface to depart from said LED lens in a direction substantially perpendicular to said central axis of said lens.

7. The LED lens as claimed in claim 6, further comprising a refracting surface caved as a concave lens in said second surface, wherein light from said LED entering said lens through said first surface and incident on said refracting surface is diffused by said refracting surface and exits said LED lens through said refracting surface.

8. The LED lens as claimed in claim 7, wherein said second surface without said refracting surface is planar.

9. The LED lens as claimed in claim 6, wherein said first surface is planar.

10. The LED lens as claimed in claim 6, wherein the included angle between said reflecting surface and said central axis of said lens ranges between 45° and 52°.

11. The LED lens as claimed in claim 6, wherein said LED lens is made of poly methyl methacrylate (PMMA) materials.

12. The LED lens as claimed in claim 6, wherein said frustum is the portion of a cone which lies between said first surface cutting the apex of said cone and said second surface.

13. A light emitting device, comprising:
a LED (Light Emitting diode) comprising:
an LED package bases; and
an LED chip disposed on said LED package base; and
a LED lens disposed on said LED, wherein said LED lens comprises:
a first surface, situated at the bottom of said LED lens;
a second surface, situated at the top of said LED lens, wherein the area of said second surface is bigger than the area of said first surface, and light from said LED entering said lens through said first surface exits said lens through said second surface; and a reflecting surface, straight extending as a lateral peripheral surface of a frustum from said first surface to said second surface and obliquely angled with respect to a central axis of said lens, wherein light from said LED entering said lens through said first surface and incident on said reflecting surface from the inside of said LED lens is reflected by said reflecting surface to exit said LED lens through said second surface, and light from said LED not entering said lens and directly incident on said reflecting surface from the outside of said LED lens is reflected by said reflecting surface to depart from said LED lens in a direction substantially perpendicular to said central axis of said lens.

14. The light emitting device as claimed in claim 13, further comprising a refracting surface caved as a concave lens in said second surface, wherein light from said LED entering said lens through said first surface and incident on said refracting surface is diffused by said refracting surface and exits said LED lens through said refracting surface.

15. The light emitting device as claimed in claim 14, wherein said second surface without said refracting surface is planar.

16. The light emitting device as claimed in claim 13, wherein said first surface is planar.

17. The light emitting device as claimed in claim 13, wherein the included angle between said reflecting surface and said central axis of said lens ranges between 45° and 52°.

18. The light emitting device as claimed in claim 13, wherein said LED lens is made of poly methyl methacrylate (PMMA) materials.

19. The light emitting device as claimed in claim 13, wherein said frustum is the portion of a cone which lies between said first surface cutting the apex of said cone and said second surface.

20. The light emitting device as claimed in claim 13, wherein said LED is partially covered with said first surface, wherein the area of said first surface is smaller than the area of said LED.

* * * * *